United States Patent
Zhang et al.

(10) Patent No.: US 7,333,340 B2
(45) Date of Patent: Feb. 19, 2008

(54) MOUNTING DEVICE FOR HEAT DISSIPATING APPARATUS

(75) Inventors: Jie Zhang, Guangdong (CN); Ching-Bai Hwang, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 217 days.

(21) Appl. No.: 11/162,611

(22) Filed: Sep. 16, 2005

(65) Prior Publication Data
US 2006/0232944 A1    Oct. 19, 2006

(30) Foreign Application Priority Data
Apr. 14, 2005    (CN) .................... 2005 1 0034240

(51) Int. Cl.
H05K 7/20    (2006.01)
F28F 7/00    (2006.01)

(52) U.S. Cl. ............... 361/719; 165/80.3; 165/185; 361/704; 361/694; 361/695; 361/700

(58) Field of Classification Search ............. None
See application file for complete search history.

(56) References Cited

U.S. PATENT DOCUMENTS 5,730,210 A * 3/1998 Kou ................... 165/80.3
5,901,034 A * 5/1999 Fuglister ................ 361/641
5,901,039 A   5/1999 Dehaine et al.
6,304,452 B1 * 10/2001 Lo ....................... 361/704
6,307,748 B1 * 10/2001 Lin et al. ................ 361/704
6,442,045 B1 * 8/2002 Goodwin et al. ......... 361/816
6,745,752 B1 * 6/2004 Jensen et al. ............ 123/470
6,826,054 B2 * 11/2004 Liu ...................... 361/719
6,859,368 B2 * 2/2005 Yang .................... 361/704
7,057,897 B2 * 6/2006 Leu ..................... 361/704
7,126,826 B1 * 10/2006 Sorensen et al. ......... 361/719
7,142,422 B2 * 11/2006 Lee et al. ............... 361/695
2006/0007659 A1 * 1/2006 Lee et al. ............... 361/704

FOREIGN PATENT DOCUMENTS

CN    2388640 Y    7/2000

* cited by examiner

Primary Examiner—Gregory D Thompson
(74) Attorney, Agent, or Firm—Winston Hsu

(57) ABSTRACT

A mounting device for mounting a first element onto a second element includes a plurality of fastening elements. Each of the fastening elements includes a connecting member defining a clasping groove therein, and a guiding portion adjacent to the clasping groove. A ring-shaped clipping member snaps in the clasping groove of the connecting member after moving over the guiding portion to be expanded. A fixing member is coupled to the connecting member for sandwiching the first element and the second element therebetween. A resilient member adapts for being sandwiched between the connecting member and the first element to provide resilient force to urge the first element toward the second element.

18 Claims, 6 Drawing Sheets

MOUNTING DEVICE FOR HEAT DISSIPATING APPARATUS

FIELD OF THE INVENTION

The present invention relates generally to a heat dissipating apparatus, and particularly to a mounting device for the heat dissipating apparatus.

DESCRIPTION OF RELATED ART

A heat dissipating apparatus always includes a circuit board with an electric component mounted thereon, a thermal module for dissipating heat generated by the electric component, and a plurality of mounting elements for mounting the thermal module onto the circuit board.

Each of the mounting elements usually includes a bolt defining an annular groove at a middle portion thereof, a coil spring disposed around the bolt, a ring-like fastener capable of being snapped in the groove, and a screw nut threadedly engaging with a screwed end portion of the bolt.

The fasteners are made of metal with good resiliency. Each of the fasteners radially defines a through slit. In assembly of the heat dissipating apparatus, the fasteners are expanded radially outwardly by a fixture to surround grooves of the bolts; then the expanding force exerted on the fasteners by the fixture is released so that the fasteners snap in the grooves of the bolts, thereby pre-assembling the bolts to the thermal module. The bolts are then screwed with the screw nuts respectively to mount the pre-assembled thermal module to the circuit board.

During the pre-assembling of the bolts and fasteners to the thermal module, since there is no mechanism formed in the bolts which can reliably ensure the snapping of the fasters into the grooves of the bolts, the fasteners may be mounted to the screwed end portions of the bolts if the fasteners are not aligned with the grooves. When this happens, the fasteners could separate from the bolts during transportation of the pre-assembled thermal module. Without the fasteners snapped in the grooves, the thermal module can not be securely mounted on the circuit board, which results in that the thermal module cannot have an intimate contact with the electric component. Furthermore, the fixture for radially expanding the fasteners has a complicated structure and accordingly a high cost.

SUMMARY OF INVENTION

According to a preferred embodiment of the present invention, a mounting device for mounting a first element onto a second element, includes a plurality of fastening elements. Each of the fastening elements includes a connecting member defining a clasping groove therein, and a guiding portion adjacent to the clasping groove and between the clasping groove and a bottom end of the connecting member. The guiding portion has a diameter larger than that of the bottom end. The guiding portion has a circumferential surface tapering toward the bottom end of the connecting member. A ring-shaped clipping member snapped in the clasping groove after moving over the guiding portion from the bottom end of the connecting member. A fixing member is coupled to the bottom end of the connecting member for sandwiching the first element and the second element therebetween. A resilient member adapts for sandwiching between the connecting member and the first element to providing resilient force to urge the first element toward the second element so that the first element can have an intimate contact with the second element.

Other advantages and novel features of the present invention will become more apparent from the following detailed description of preferred embodiment when taken in conjunction with the accompanying drawings, in which:

DETAILED DESCRIPTION

Figure 1:
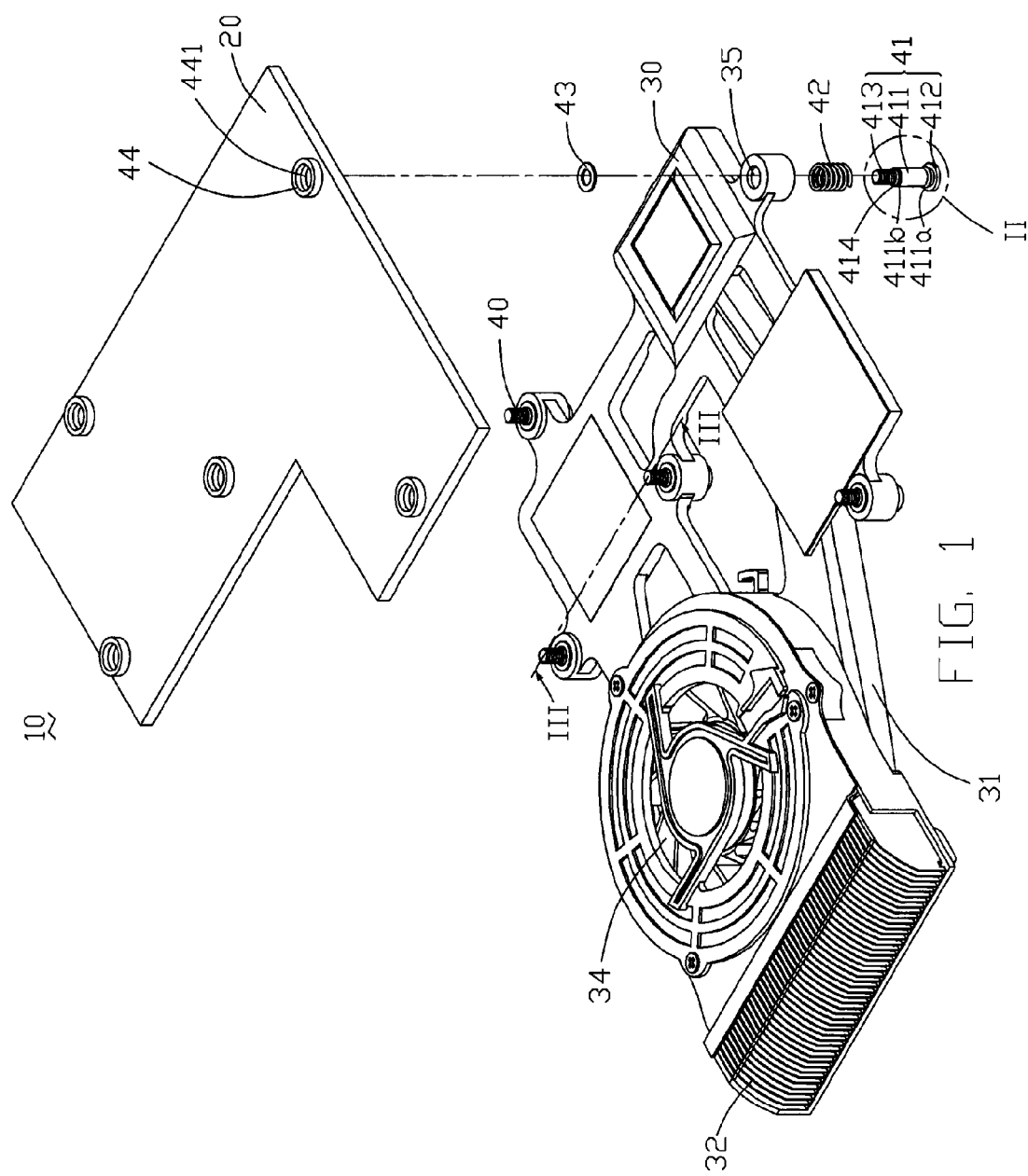
FIG. 1 is an exploded isometric view of a heat dissipating apparatus according to a preferred embodiment of the present invention.

Referring to FIG. 1, a heat dissipating apparatus 10 according to a preferred embodiment of the present invention includes a circuit board 20 with a heat generating electronic component 21 (referring to FIG. 4) mounted thereon, a thermal module 30 for timely removing heat generated by the electronic component 21, and a mounting device composed of a plurality of fastening elements 40 for fastening the thermal module 30 to the circuit board 20.

Figure 3:
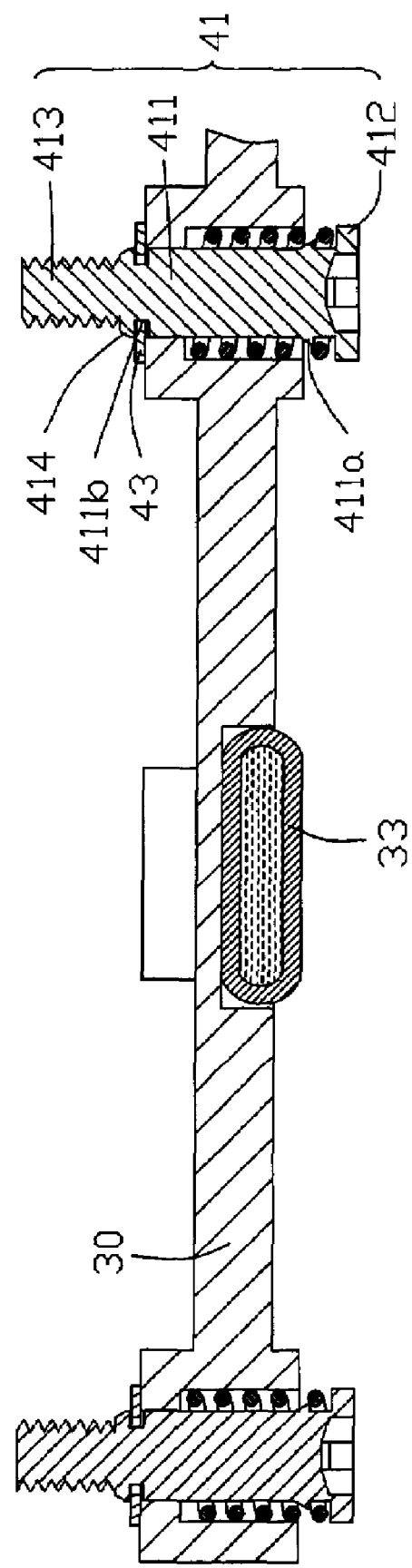
FIG. 3 a cross-sectional view taken along line III-III of FIG. 1, showing a pre-assembled thermal module.

The thermal module 30 includes a supporting plate 31, a heat sink 32 and a heat pipe 33 (referring to FIG. 3). The heat sink 32 and the heat pipe 33 are located on two opposite sides of the supporting plate 31, respectively. A heat dissipating fan 34 is located adjacent to the heat sink 32. The supporting plate 31 defines a plurality of through holes 35 at different positions thereof for receiving the fastening elements 40 therein. The heat pipe 33 thermally connects the electronic component 21 with the heat sink 32 for transferring heat from the electronic component 21 to the heat sink 32. The fan 34 is for driving an airflow through the heat sink 32 thereby to take the heat away from the heat sink 32.

Each of the fastening elements 40 includes a columned connecting member 41, a resilient member 42 for being disposed around the connecting member 41, a ring-like clipping member 43 for being snapped to a lower part of the connecting member 41, and a fixing member 44 for being screwed to an end portion of the connecting member 41.

Figure 2:
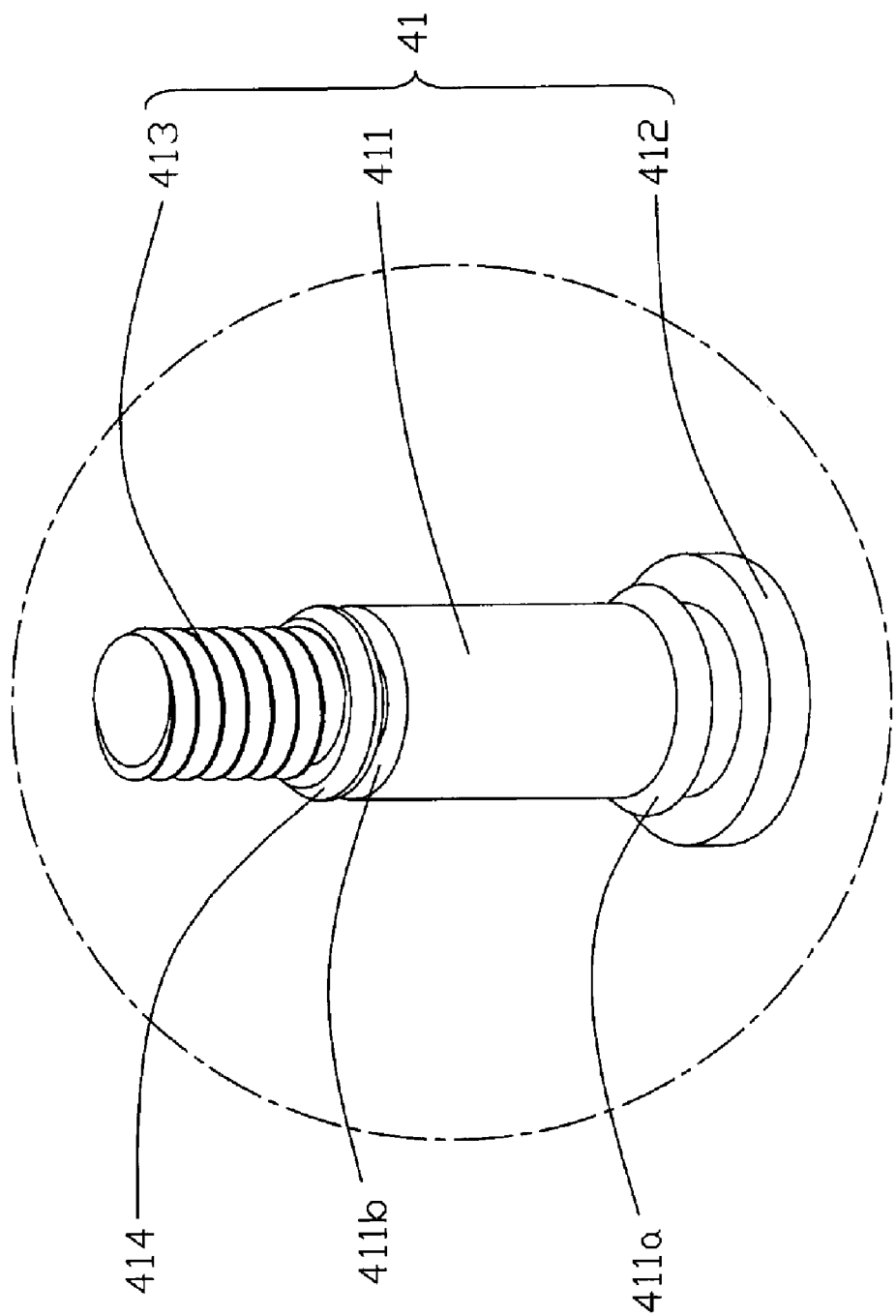
FIG. 2 is an enlarged view of a circled portion of FIG. 1 indicated by II.

Also referring to FIG. 2, the connecting member 41 includes a main portion 411, a head portion 412 positioned at a top end of the main portion 411, and a threaded fixing portion 413 formed at a bottom end of the main portion 411. The head portion 412 has a diameter larger than that of the main portion 411. The main portion 411 includes a ring-like flange 411a adjacent to the head portion 412 for engaging a top end of the resilient member 42, thereby preventing the resilient member 42 from falling off the connecting member 41. The main portion 411 also defines an annular clasping groove 411b near the fixing portion 413 for snapping of the clipping member 43 in the groove 411b. A diameter of the main portion 411 is greater than a diameter of the fixing portion 413, so that a part of the main portion 411 extends beyond the fixing portion 413 along a radial direction. A cone-shaped guiding portion 414 is formed on the main portion 411 between the groove 411b and the fixing portion 413. The guiding portion 414 has a diameter larger than that of the fixing portion 413. The guiding portion 414 is so configured that a diameter thereof is gradually increased along an axial direction of the connecting member 41 from the fixing portion 413 to the head portion 412. In other words, the guiding portion 414 has a circumferential surface tapering toward the bottom end of the connecting member 41.

The clipping member 43 is made of plastics which has good resilient capability. The clipping member 43 is formed with a ring-shaped configuration with a central hole. The clipping member 43 is sufficiently resilient that its central hole can be expanded to a degree, which enables the clipping member 43 to move over the guiding portion 414 without being damaged. The clipping member 43 may also be formed with a radially through slit to increase the resiliency of the clipping member 43, thereby to facilitate the mounting of the clipping member 43 to the connecting member 41.

The fixing member 44 is attached in a bottom face of the circuit board 20, and forms a threaded hole 441 therein for engagingly receiving the fixing portion 413 of the connecting member 41.

The resilient member 42 such as a coil spring (first embodiment, FIGS. 1-5), or a resilient metal plate spring (second embodiment, FIG. 6), is for providing resilient force to push the head portion 412 of the connecting member 41 and, accordingly, the circuit board 20 and the electronic component 21 to move upwardly, as the resilient members 42 is sandwiched between the head portion 412 and the supporting plate 31 of the thermal module 30 after the clipping member 43 is snapped in the clasping groove 411b, and the fixing portion 413 is engagingly received in the fixing member 44. The upward movement of the electronic component 21 by the resilient member 42 ensures that the electronic component 21 has an intimate contact with the thermal module 30.

Figure 4:
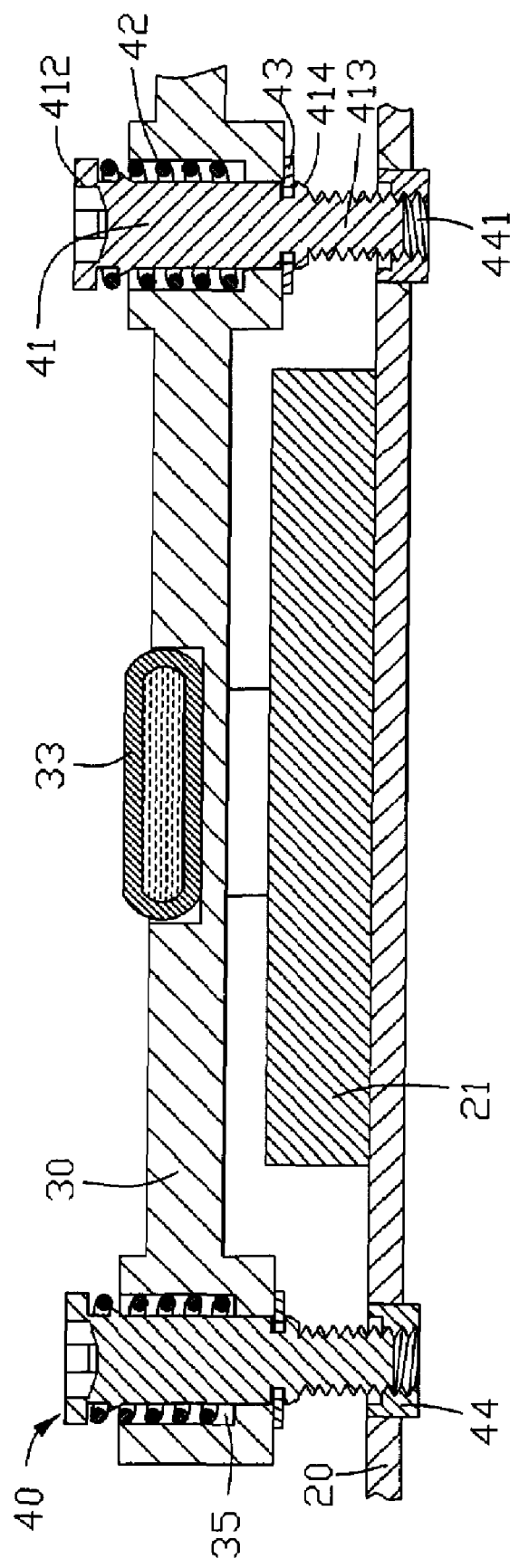
FIG. 4 is a view similar to FIG. 3, showing the pre-assembled thermal module mounted to a circuit board having an electronic component thereon, wherein connecting members and fixing members of the heat dissipating apparatus are assembled at an initial position.
Figure 5:
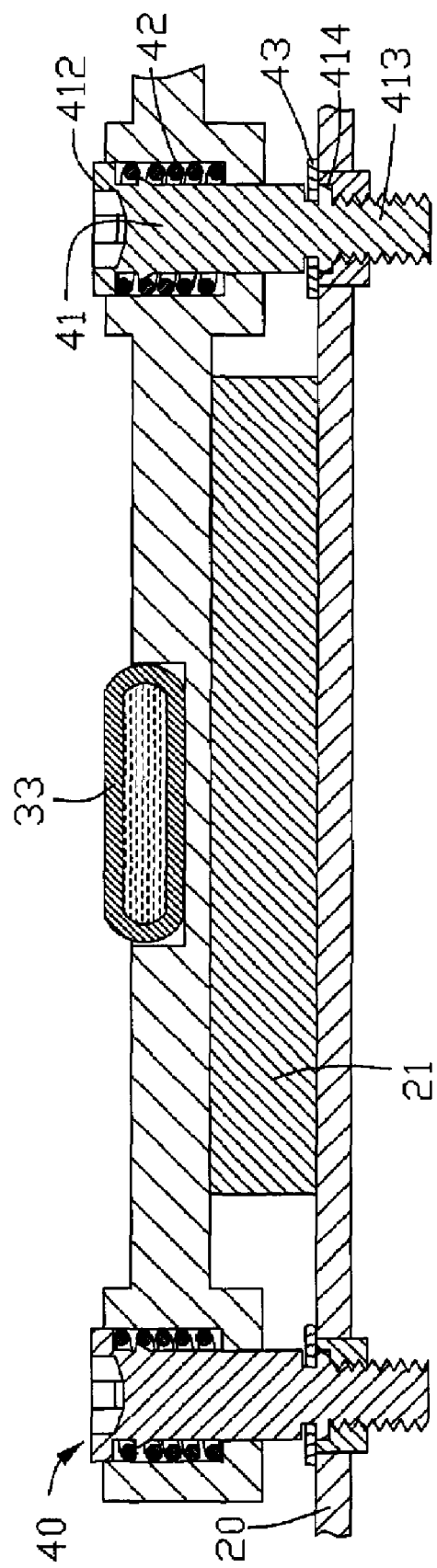
FIG. 5 is a view similar to FIG. 4, with the connecting members and the fixing members are assembled at a final position.

Referring to FIG. 3 to FIG. 5, in assembly of the heat dissipating apparatus 10, the coil springs 42 are mounted to surround the main portions 411 of the connecting members 41 with the top ends of the coil springs 42 engaging with the flanges 411a, respectively. The connecting members 41 of the fastening elements 40 are placed in the corresponding through holes 35 of the thermal module 30. The head portions 412 of the fastening elements 40 are then pressed toward the supporting plate 31 of the thermal module 30 until the clasping grooves 411b extend upwardly beyond the thermal module 30. At this position, the coil springs 42 are compressed between the head portions 412 and the supporting plate 31 of the thermal module. Thereafter, the clipping members 43 are mounted to the corresponding connecting members 41 by extending the bottom ends of the connecting members 41 into the central holes of the clipping members 43, respectively. The clipping members 43 are moved downwardly to run over the guiding portions 414 and finally snap into the grooves 411b. During moving over the guiding portions 414, the clipping members 43 are gradually resiliently expanded by the tapered circumferential surfaces of the guiding portions 414 until the clipping members 43 reach and snap into the grooves 411b, in which the clipping members 43 return to their original dimensions and configurations. Thus, the fastening elements 40, the thermal module 30 and the clipping members 43 are assembled together with the clipping members 43 abutting against a bottom surface of the supporting plate 31 of the thermal module 30 under the resilient force exerted by the coil springs 42 (FIG. 3). Now particularly referring to FIG. 4, the fixing portions 413 are then turned over and brought to threadedly engaging in the threaded holes 441 of the fixing members 44 by rotating the head portions 412. The heat portions 412 are continuously rotated until fixing portions 413 completely threadedly engage in the threaded holes 441, the clipping members 43 contact with the circuit board 20 and the coil springs 42 are further compressed (FIG. 5). Thus, the circuit board 20 and the supporting plate 31 of the thermal module 30 are sandwiched between the head portions 412 of the connecting members 41 and the fixing members 44, with the electronic component 21 intimately contacting with a bottom surface of the thermal module 30.

In the present invention, the clipping member 43 is first pressed on the guiding portion 414 and then snapped in the corresponding clasping groove 411b after leaving the guiding portion 414. The clipping member 43 is expanded by the guiding portion 414 on the connecting member 41, rather than by a fixture for mounting the clipping member 43 to the connecting member 41; thus, the fixture can have a simple structure and accordingly a low cost. Furthermore, since the clipping member 43 is mounted to the connecting member 41 along an axial direction thereof, not a radial direction thereof like the conventional art, the clipping member 43 can be more easily, reliably and correctly positioned to snap into the groove 411b, without the disadvantage of the conventional art that the clipping member may engage in the fixing portion 413. Finally, the mounting of the clipping member 43 to the groove 411b of the connecting member 41 in accordance with the present invention can be more quickly completed than the conventional art.

Figure 6:
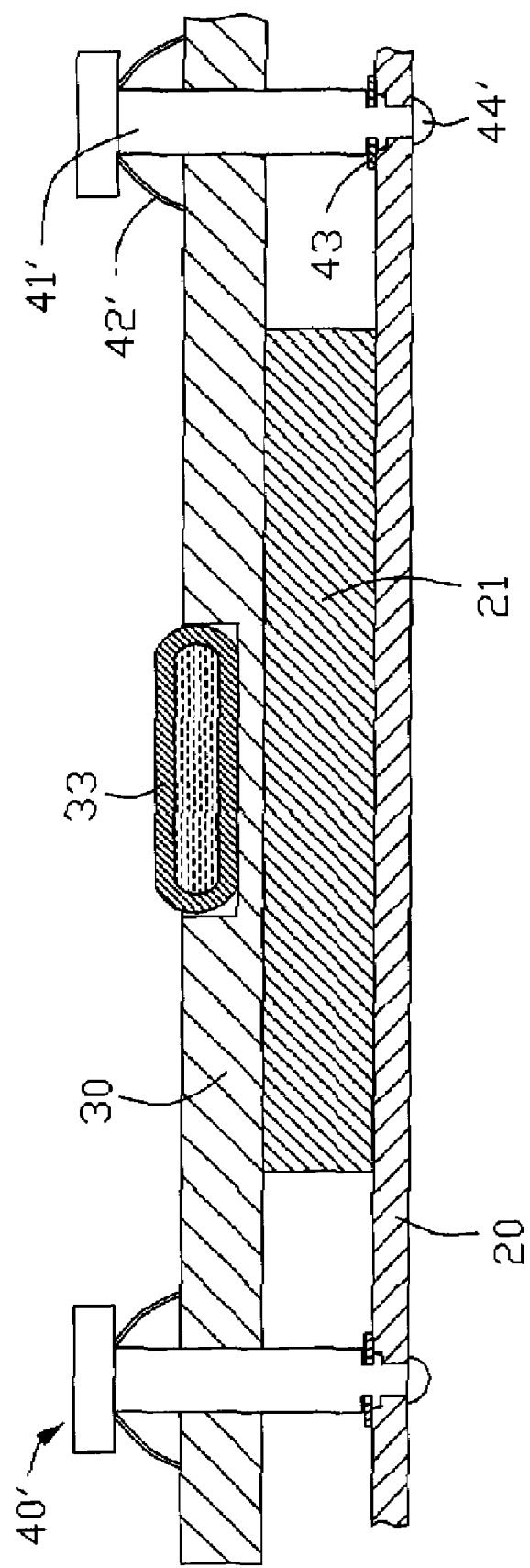
FIG. 6 is a cross-sectional view of a heat dissipating apparatus according to another embodiment of the present invention.

Referring to FIG. 6, another embodiment of the present invention is shown. The difference of this embodiment over the previous embodiment is as follows. The bottom ends of the connecting members 41' of the fastening elements 40' are coupled to the fixing members 44' by riveting, not by threaded engagement of the previous embodiment. Furthermore, the resilient members 42' in this embodiment are resilient metal plate springs instead of the coil springs.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting device for mounting a first element onto a second element, comprising a plurality of fastening elements, each of the fastening elements comprising:
   a connecting member defining a clasping groove therein, and a guiding portion adjacent to the clasping groove;
   a ring-shaped clipping member snapping in the clasping groove of the connecting member after moving over the guiding portion to be expanded;
   a fixing member coupled to the connecting member adapted for sandwiching the first element and the second element therebetween; and a resilient member adapted for being sandwiched between the connecting member and the first element for providing resilient force to urge the first element toward the second element;

wherein the guiding portion is cone-shaped.

2. The mounting device as described in claim 1, wherein the first element is a thermal module, and the second element is a circuit board.

3. The mounting device as described in claim 1, wherein the clipping member is made of plastics.

4. The mounting device as described in claim 1, wherein the resilient member is disposed around the connecting member.

5. The mounting device as described in claim 4, wherein the resilient member is one of a coil spring and a resilient metal plate spring.

6. The mounting device as described in claim 1, wherein the connecting member is screwed in the fixing member.

7. The mounting device as described in claim 1, wherein the connecting member is riveted to the fixing member.

8. A heat dissipating apparatus comprising:
a circuit board with a heat generating electronic component mounted thereon;
a thermal module contacting with the electronic component for dissipating heat generated by the electronic component; and
a mounting device fastening the thermal module to the circuit board together, the mounting device comprising:
a plurality of connecting members mounted to the thermal module, each connecting member comprising a main portion defining a clasping groove therein, a fixing portion extending from a bottom end of the main portion, a guiding portion between the clasping groove and the fixing portion, and a head portion disposed at a top end of the main portion;
a plurality of resilient members each compressed between the head portion of a corresponding connecting member and the thermal module;
a plurality of clipping members each snapped in the clasping groove of a corresponding connecting member after moving over the guiding portion to be expanded; and
a plurality of fixing members each attached to the circuit board and coupled to the fixing portion of a corresponding connecting member thereby fastening the fixing portion to the circuit board;
wherein a diameter of the guiding portion is gradually increased from the fixing portion to the main portion of each connecting member.

9. The heat dissipating apparatus as described in claim 8, wherein the main portion comprises a ring-shaped flange adjacent to the head portion for clasping a top end of the resilient member.

10. The heat dissipating apparatus as described in claim 8, wherein the resilient members are disposed around the main portions of the connecting members, respectively.

11. The heat dissipating apparatus as described in claim 10, wherein each of the resilient members is one of a coil spring and a resilient metal plate spring.

12. The heat dissipating apparatus as described in claim 8, wherein the fixing portions of the connecting members are screwed to the fixing members, respectively.

13. The heat dissipating apparatus as described in claim 8, wherein the fixing portions of the connecting members are riveted to the fixing members, respectively.

14. An assembly comprising:
a thermal module adapted for cooling a heat-generating electronic component mounted on a circuit board;
a plurality of connecting members mounted to the thermal module, each connecting member having a top head, a bottom end, a groove between the top head and the bottom end and a guiding portion between the groove and the bottom end, the guiding portion having a diameter larger than that of the bottom end and a circumferential surface tapering toward the bottom end, the bottom end being adapted for fastening with the circuit board;
a plurality of resilient members each being compressed between the thermal module and the top head of a corresponding connecting member; and
a plurality of ring-shaped clipping members each snapping in the groove of a corresponding connecting member, wherein the clipping members move over the guiding portions from the bottom ends of the connecting members before snapping into the grooves, respectively.

15. The assembly as described in claim 14, wherein the clipping members abut against a bottom surface of the thermal module.

16. The assembly as described in claim 14, wherein the thermal module defines a plurality of holes, the resilient members being coil springs received in the holes, respectively.

17. The assembly as described in claim 16, wherein the bottom ends of the connecting members are fastened to the circuit board by threaded engagement.

18. The assembly as described in claim 14, wherein the resilient members are metal plate springs, and the bottom ends of the connecting members are fastened to the circuit board by riveting.

* * * * *